United States Patent
Zhu et al.

(10) Patent No.: US 6,858,531 B1
(45) Date of Patent: Feb. 22, 2005

(54) ELECTRO CHEMICAL MECHANICAL POLISHING METHOD

(75) Inventors: Mei Zhu, San Jose, CA (US); Wilbur G. Catabay, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/195,044

(22) Filed: Jul. 12, 2002

(51) Int. Cl.[7] .......................................... H01L 21/4763
(52) U.S. Cl. ..................... 438/633; 438/645; 438/692; 438/693
(58) Field of Search ................................ 438/633, 645, 438/692, 693, FOR 111, FOR 330

(56) References Cited

U.S. PATENT DOCUMENTS

| | | | |
|---|---|---|---|
| 4,789,648 A | | 12/1988 | Chow et al. ................. 437/225 |
| 5,846,398 A | * | 12/1998 | Carpio ........................ 205/775 |
| 5,911,619 A | * | 6/1999 | Uzoh et al. .................... 451/5 |
| 5,944,589 A | * | 8/1999 | Nakajima .................... 451/285 |
| 6,126,532 A | * | 10/2000 | Sevilla et al. ............... 451/526 |
| 6,368,190 B1 | * | 4/2002 | Easter et al. .................. 451/41 |
| 6,423,640 B1 | * | 7/2002 | Lee et al. .................... 438/690 |
| 6,432,828 B2 | * | 8/2002 | Kaufman et al. ........... 438/693 |
| 6,468,913 B1 | * | 10/2002 | Pasqualoni et al. ......... 438/693 |
| 2001/0013507 A1 | * | 8/2001 | Hosali et al. ................. 216/89 |
| 2002/0119286 A1 | * | 8/2002 | Chen et al. ................. 428/131 |

OTHER PUBLICATIONS

Wang et al., "Stress-free polishing advances copper integration with ultralow-κ dielectrics", Solid State Technology, Oct. 2001, www.solid-state.com.

* cited by examiner

*Primary Examiner*—George Fourson
*Assistant Examiner*—Michelle Estrada
(74) *Attorney, Agent, or Firm*—Beyer Weaver & Thomas, LLP

(57) ABSTRACT

Embodiments of the invention include a method for electro chemical mechanical polishing of a substrate. The process includes flowing an electro chemical mechanical polishing (ECMP) slurry having a high viscosity with a polishing agent over a portion of the substrate. Electrical current is passed through the slurry and substrate. The electrical current, in conjunction with the abrading action of the slurry as it flows over the surface of the substrate, serves to remove at least a portion of the metal layer from the substrate. The invention also includes various slurry embodiments.

27 Claims, 2 Drawing Sheets

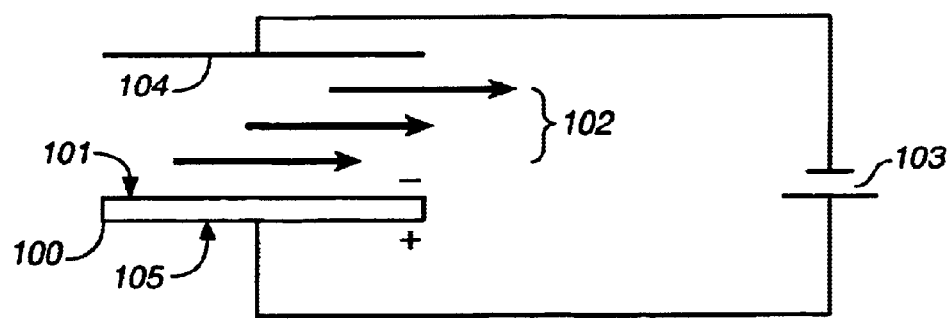
FIG._1a
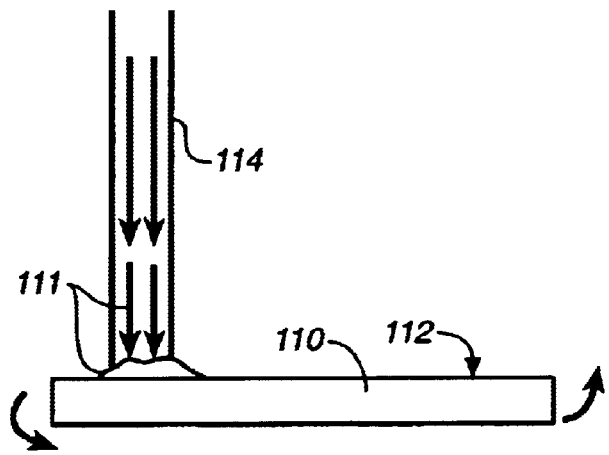
FIG._1b
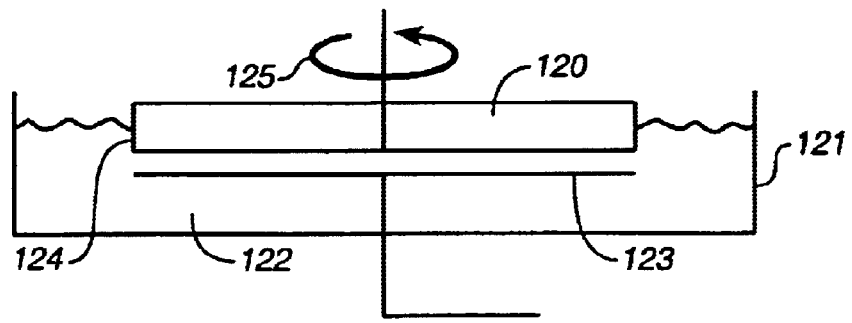
FIG._1c

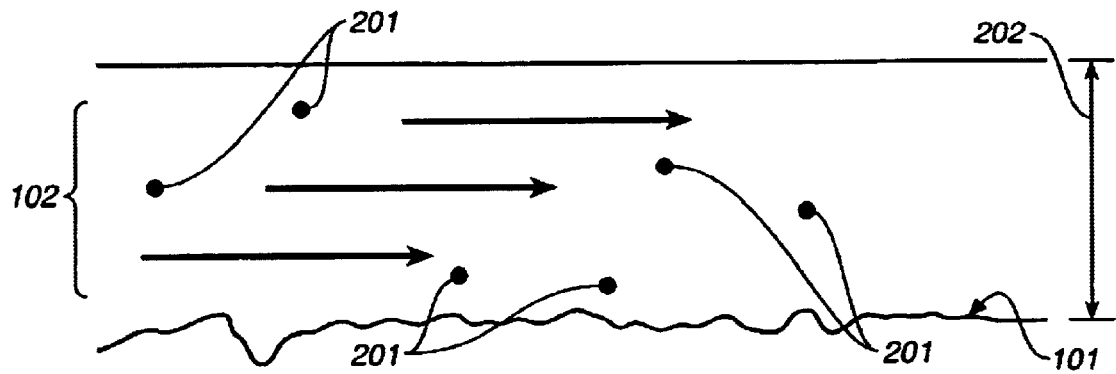
FIG._2
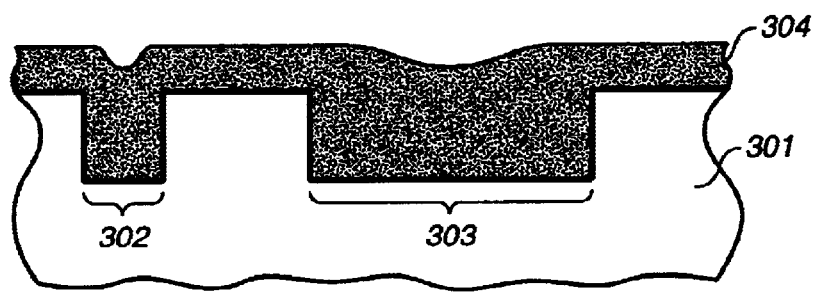
FIG._3a
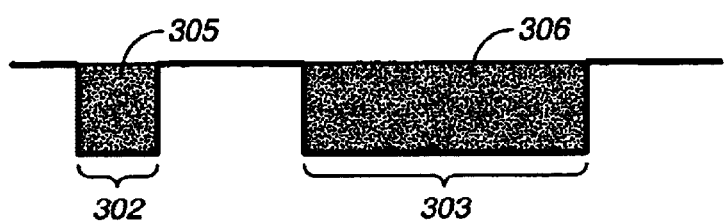
FIG._3b

ELECTRO CHEMICAL MECHANICAL POLISHING METHOD

TECHNICAL FIELD

The invention described herein relates generally to semiconductor surface polishing methods. In particular, the invention relates to methods and slurry compositions for electro chemical mechanical polishing of semiconductor surfaces.

BACKGROUND

Integrated circuits are made up of millions of active devices formed in or on silicon substrates. The active devices are interconnected to form functional circuits and components. The devices are interconnected through the use of well-known multilevel interconnections. Interconnection structures normally have a first layer of metallization, an interconnection layer, a second level of metallization, and sometimes a third or other subsequent levels of metallization. Interlevel dielectrics, such as doped and undoped silicon dioxide ($SiO_2$) or low-K dielectric materials, are used to electrically isolate the different levels of metallization in a silicon substrate or well. The electrical connections between different interconnection levels are made through the use of metallized vias. U.S. Pat. No. 4,789,648, which is incorporated herein by reference, describes a method for preparing multiple metallized layers and metallized vias in insulating films. Metallization layers are also used to form electrical interconnections on the same layer of a semiconductor device. Additionally, metal contacts are used to form electrical connections between interconnection levels and devices formed in wells. Metal vias and contacts may be filled with various metals and alloys including titanium (Ti), titanium nitride (TiN), tantalum (Ta), aluminum copper (Al—Cu), aluminum silicon (Al—Si), copper (Cu), tungsten (W), and combinations thereof.

In one conventional semiconductor manufacturing process, metallized vias or contacts are formed by a blanket metal deposition followed by a chemical mechanical polish (CMP) step. In one example process, via holes are etched through an interlevel dielectric (ILD) to interconnection lines or to a semiconductor substrate. Next, a thin adhesion layer such as tantalum nitride and/or tantalum is generally formed over the ILD and is directed into the etched via hole. Then, a metal film is blanket deposited over the adhesion layer and into the via hole. Deposition is continued until the via hole is filled with the blanket deposited metal. Finally, the excess metal is removed by chemical mechanical polishing (CMP) to form metal vias.

In a typical chemical mechanical polishing process, the substrate is placed in direct contact with a rotating polishing pad. Pressure is applied to maintain pressure against the backside of the substrate. During the polishing process, the pad and substrate are rotated with respect to each other while pressure is maintained between the substrate and pad. An abrasive and chemically reactive solution, commonly referred to as a "slurry", is applied to the pad during polishing. The slurry initiates the polishing process by abrading and chemically reacting with the film being polished. The polishing process is facilitated by the rotational movement of the pad relative to the substrate while a slurry is provided at the wafer/pad interface. Polishing continues in this manner until the desired film on the insulator is removed. The slurry composition is an important factor in the CMP step. Depending on the choice of the oxidizing agent, the abrasive, as well as certain other additives, the polishing slurry can be tailored to provide effective polishing to metal layers at desired polishing rates while minimizing surface imperfections, defects and corrosion and erosion.

Typically CMP polishing slurries contain abrasive materials, such as silica or alumina, suspended in an oxidizing, aqueous medium. For example, slurries containing alumina, hydrogen peroxide, and either potassium or ammonium hydroxide are useful for removing tungsten at predictable rates with little removal of the underlying insulating layer. Many other slurry compositions are used to react and selectively abrade the surface of a substrate.

In another approach, used for CMP of copper metallization layers, abrasives are suspended in an ethylene glycol mixture that contains a phosphoric acid ($H_3PO_4$) oxidizer. Although generally suitable, such a slurry suffers from a number of drawbacks. CMP with such a slurry results in excessive dishing in wider copper regions. In general, such a process also induces erosion of copper interconnect structures and damages low-K films on semiconductor wafers. Such a process can also leave isolated copper "islands" that can cause metal line bridging and shorting. Most importantly, CMP with such slurries is not effective at removing smaller sub-micron surface defects.

Although certain of these conventional CMP processes and slurries have proven useful, improvements can be made. Desirable surface polishing processes and materials exhibit good thin film polishing selectivity and simultaneously give polished substrates with minimal dishing, low defectivity, and low incidence of isolated metal "islands" on the polished surfaces. In particular, a method is needed for polishing copper-containing metallization layers with good thin film polishing selectivities and simultaneously achieve minimal dishing and low defectivity in the copper-containing layers. For these and other reasons, improved polishing methods and materials are needed.

SUMMARY OF THE INVENTION

In accordance with the principles of the present invention, methods, materials, and apparatus for electro chemical mechanical polishing are disclosed.

Embodiments of the invention include a method for electro chemical mechanical polishing of a substrate. The process includes flowing an electro chemical mechanical polishing (ECMP) slurry having a high viscosity and including a polishing agent over a portion of the substrate. Simultaneously, an electrical current is passed through the slurry and substrate. The electrical current, in conjunction with the abrading action of the slurry as it flows over the surface of the substrate, serves to remove at least a portion of the metal layer from the substrate.

Another embodiment of the invention describes an electro chemical mechanical polishing slurry used for polishing a semiconductor surface. The slurry includes a high viscosity solvent admixed with a polishing agent, the combination being electrically conducting. Optional additives can include chelating agents and passivating film forming agents.

These and other aspects of the present invention are described in greater detail in the detailed description of the drawings set forth hereinbelow.

BRIEF DESCRIPTION OF THE DRAWINGS

The following detailed description will be more readily understood in conjunction with the accompanying drawings, in which:

FIGS. 1(a)–1(c) depict apparatuses capable of accomplishing electro chemical mechanical polishing in accordance with the principles of the present invention.

FIG. 2 is a close-up cross-section view of a portion of a wafer surface showing a slurry of the present invention flowing over the surface in accordance with the principles of the present invention.

FIGS. 3(a) and 3(b) are cross-section views of a wafer surface showing the effects of electro chemical mechanical polishing under various conditions in accordance with the principles of the present invention.

It is to be understood that, in the drawings, like reference numerals designate like structural elements. Also, it is understood that the depictions in the figure are not necessarily to scale.

DETAILED DESCRIPTION OF THE DRAWINGS

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

The following detailed description describes various embodiments of the present invention. An embodiment of the present invention relates to an electro chemical mechanical polishing process and electrolytic slurry that enables such a process to be achieved. Slurry embodiments in accordance with the principles of the present invention include a polishing agent suspended in a high viscosity solvent. The slurry of the present invention must also be electrically conducting. Additionally, in some embodiments, the polishing agents can include abrasive materials, heavy ion complexes, or foams. Other embodiments can add chelating agents and film forming agents to the slurry. The details of some of these slurry embodiments are described below. These electro chemical mechanical polishing slurries are useful for polishing metals, especially copper and copper-containing metal layers associated with a substrate selected from the group including, but not limited to, integrated circuits, thin films, multiple level semiconductors, and wafers.

Before describing the details of the various preferred embodiments of this invention, some of the terms that are used herein will be defined. The electro chemical mechanical polishing slurry ("ECMP slurry") of this invention comprises a high viscosity solvent, a polishing agent, and other optional ingredients. The ECMP slurry is useful for polishing metallization structures and multi-level metallization structures which may include, but are not limited to, semi-conductor thin-films, integrated circuit thin-films, and for any other films and surfaces where such processes are useful. The terms "copper" and "copper-containing" are used interchangeably herein as it is within the understanding of one of skill in the art that the terms include, but are not limited to, substrates comprising layers of pure copper, copper silicon material, copper aluminum alloys, and Ta/TaN/Cu multi-layer substrates, as well as a variety of other materials having a copper component.

A process of the present invention utilizes such slurries in combination with an applied electrical current to achieve surface polishing having good thin film polishing selectivity and simultaneously give polished substrates with minimal dishing and low defectivity. Such a process is of particular utility when applied to substrate implementing copper-containing metallization structures.

An electro chemical mechanical polishing method embodiment of the present invention comprises, in most general terms, flowing a suitable electrically conducting high viscosity slurry over a surface of a substrate. Simultaneously, an electrical current is passed through the substrate and the slurry. The current is biased so that material is electrically removed from the surface into the slurry. This process of electrically removing material from the substrate is further enhanced by the polishing action of mechanical forces generated by the high viscosity ECMP slurry as it flows across the surface of the substrate. These mechanical forces are enabled by polishing agents present in the slurry. These polishing agents remove material from the surface of the substrate as the slurry flows over the surface of the substrate.

Process and Apparatus

FIG. 1(a) is a schematic depiction of an aspect of the invention. A semiconductor wafer 100 is positioned with the surface 101 to be polished facing the slurry. A suitable slurry (which will be discussed more hereinbelow) is flowed (diagrammatically depicted by the arrows 102) over the surface 101 of the wafer 100. At the same time, a current is passed through the flowing slurry 102 and the wafer 100. A current source 103 is schematically shown connected to a plate 104 and the backside 105 of the wafer 100. Thus, the current flows from the plate 104, through the slurry 102, and through the wafer 100. The current is biased (indicated by the +/− signs) to draw positively charged ions from the surface 101 of the wafer 100 into the slurry 102. This is particularly effective at drawing metal ions (e.g., $Cu^{++}$ and/or other metal ions) from the surface 101 into the slurry 102. Additionally, mechanical forces are generated by the movement of the slurry 102 over the surface 101 of the wafer 100. In conjunction with the applied current, the movement of the slurry 102 removes material from the surface 101 of the wafer 100. This is enhanced by the presence of polishing agents in the slurry 102. In some embodiments, the slurry 102 contains chelating agents that bond to the removed material and prevent the removed material from re-depositing on the surface 101.

An important attribute of the invention is the slurry flow over the surface of the wafer. FIG. 1(b) is a side view of a wafer 110 being spun at a suitable rate of rotation while slurry 111 is being flowed onto the surface 112 of the wafer 110. Due to the high rate of rotation of the wafer 110 and the relatively high viscosity of the slurry 111, mechanical forces are generated by the slurry 111 as it flows over the wafer surface 112. This force acts at the interface between the slurry 111 and the wafer surface 112. In the depicted embodiment, the slurry 111 is flowed onto the surface 112 using an effluent tube 114. Many other implementations are possible. The electrical current removes some material from the surface 112 and the polishing agents within the slurry 111 remove additional material from the surface 112. In the depicted embodiment, the tube 114 serves as a cathode and the wafer surface serves as an anode. In one embodiment, the wafer 100 is rotated at greater than about 200 rpm. Other aspects of this process are further detailed hereinbelow.

Another approach is schematically depicted in FIG. 1(c). A wafer 120 is placed in a bath 121 having an amount of suitable slurry 122 contained therein. An electrode 123 is placed in proximity with the surface of the wafer 120. The electrode 123 is positioned such that electrical current can flow between the electrode 123 and the desired portions of the surface of the wafer 120. At the same time, the wafer is rotated (see, arrow 125) such that a sufficient mechanical force is exerted by the slurry at the interface between the slurry 122 and the polished surface 124 of the wafer 120.

FIG. 2 is another schematic view of the surface of the wafer. The surface 101 of the wafer is shown with a laminar flow (depicted by the arrows) of slurry 102 flowing over the surface 101. Also depicted are particles 201 suspended in the slurry 102. Such particles 201 comprise a polishing agent present in the slurry 102. Such particles 201 can be abrasive particles used to polish the surface 101. Such particles 201 can also be heavy metal complexes formed of materials removed from the surface 101 and now suspended in the slurry 102. In some embodiments, a chelating agent can be used to facilitate the formation of such heavy metal complexes. The particles 201 can also comprise bubbles formed in a foam, the bubbles serving as a polishing agent to polish the surface. The depth 202 of the slurry 102 over the surface 101 is not critical. However, in some preferred embodiments, a slurry depth 202 over the surface 101 of the wafer of about 5 mm to about 10 mm is desired. An important aspect of the invention is the generation of mechanical forces at the interface between the slurry and the surface of the substrate. These mechanical forces generate some degree of polishing which is assisted by the presence of a polishing agent and the application of an electrical current. Thus, it is important that the slurry have a high enough viscosity to generate sufficient mechanical force between the slurry and the surface of the substrate. Viscosity and other details of suitable electro chemical mechanical polishing slurries are discussed below.

Referring to FIGS. 1(*a*)–1(*c*) and 2, an ECMP slurry is flowed over the surface of the substrate as an electrical current is applied. This comprises passing an electrical current in the range of about 5 milliamps (mA)/cm$^2$ to about 50 mA/cm$^2$ through the ECMP slurry and the substrate. This current can be applied as a direct current (DC) or as a series of electrical pulses. Application of such current results in a polished surface that is more uniformly planarized rather than following the conformation of the surface. Such a profile exhibits less dishing in the polished surfaces. Also, such pulsed current application is effective for removing islands from the polished surface The foregoing concepts can be illustrated with reference to FIGS. 3(*a*) and 3(*b*). FIG. 3(*a*) depicts a semiconductor substrate surface 301 having openings 302, 303 formed therein. These openings 302, 303 are covered with a deposited metal layer 304. By flowing a slurry of the present invention over the surface and applying a current, polishing is accomplished. If it is desired that the polishing profile be flatter (i.e., not be highly conformal with the substrate surface 301), a series of pulses having a relatively short time duration can be used. For example, if a surface having circuit features or openings on the order of about 100 nm to about 1 micron ($\mu$) is polished, a pulse time (the time the current is "on") of on the order of 50 milliseconds (ms) or shorter can be used. As a result, there will be fewer islands formed in the final polished surface.

Among the many suitable duty cycles are embodiments that use simple "on" "off" duty cycles having "on" cycles ranging from about 10 ms to about 50 ms. Also, the "time off" portion of the duty cycle can range from 0 ms to about 5 ms. A series of such pulses enables the formation of the relatively planar polishing profile depicted in FIG. 3(*b*). FIG. 3(*b*) shows relatively little dishing in either the wide opening 303 or the relatively narrower opening 302. Thus, the surfaces of the remaining metal layers 305, 306 are relatively flat.

Slurry Embodiments

Another aspect of the invention includes the slurry used in conjunction with the process of the present invention. The ECMP slurry of the present invention, in its most basic implementation, includes a high viscosity solvent and polishing agent combined in an electrically conducting slurry.

For the purposes of this patent, a high viscosity solvent is a material having a viscosity of on the order of 10 centipoise (cp) or higher. Also, for purposes of this patent, solvent means a liquid in which the other components of the slurry are either dissolved in or suspended in. Suitable materials preferably have a viscosity of on the order of about 12 cp to about 20 cp. One suitable material is ethylene glycol having a viscosity of about 16 cp (at 25° C.). Other materials having sufficient viscosity and sufficient ability to suspend additives can be chosen.

In addition to the high viscosity solvent, the slurry includes a polishing agent. Polishing agents can include, for example, foams, abrasives, heavy ion complexes, as well as other materials which assist in the polishing of selected surfaces. For example, one slurry of this invention includes an abrasive. Abrasives typically comprise oxide materials. Such oxide materials can include metal oxide abrasives selected from the group including, but not limited to, silicon dioxide, alumina, titania, zirconia, germania, silica, ceria and mixtures thereof. The ECMP slurry of this invention preferably includes from about 1.0 to about 20.0 weight percent or more of an abrasive. It is more preferred, however, that the slurry of this invention includes from about 5.0 to about 10.0 weight percent abrasive Such metal oxide abrasives may be produced by any techniques known to those skilled in the art. In one embodiment, satisfactory metal oxide abrasives can be produced using any high temperature process such as sol-gel, hydrothermal or plasma process, or by processes for manufacturing fumed or precipitated metal oxides. The metal oxides can be fumed or precipitated abrasives, such as fumed silica or fumed alumina. For example, the production of fumed metal oxides is a well-known process which involves the hydrolysis of suitable feedstock vapor (such as aluminum chloride for an alumina abrasive) in a flame of hydrogen and oxygen. Molten particles of roughly spherical shapes are formed in the combustion process, the diameters of which are varied through process parameters. These molten spheres of alumina or similar oxide, typically referred to as primary particles, fuse with one another by undergoing collisions at their contact points to form branched, three-dimensional chain-like aggregates. The force necessary to break aggregates is considerable. During cooling and collecting, the aggregates undergo further collision that may result in some mechanical entanglement to form agglomerates. Agglomerates are thought to be loosely held together by van der Waals forces and can be reversed, i.e., de-agglomerated, by proper dispersion in a suitable media.

Precipitated abrasives may be manufactured by conventional techniques, such as by coagulation of the desired particles from an aqueous medium under the influence of high salt concentrations, acids or other coagulants. The particles are filtered, washed, dried and separated from residues of other reaction products by conventional techniques known to those skilled in the art.

In one embodiment, a satisfactory oxide abrasive consists of oxide particles having a size distribution less than about 80 nm, a mean particle diameter less than about 50 nm and a force sufficient to repel and overcome the van der Waals forces between abrasive aggregates themselves. Such oxide abrasive has been found to be effective in minimizing or avoiding scratching, pit marks, divots and other surface imperfections during polishing. The particle size distribution in the present invention may be determined utilizing known techniques such as transmission electron microscopy (TEM). The mean particle diameter refers to the average equivalent spherical diameter when using TEM image analysis, i.e., based on the cross-sectional area of the particle. As used in this paragraph, force means that either the surface potential or the hydration force of the metal oxide particles must be sufficient to repel and overcome the van der Waals attractive forces between the particles. The abrasives can be added to the slurry by subjecting it to high shear mixing conditions known to those skilled in the art.

In another embodiment, the polishing agent can comprise a foam. The bubbles in the foam can gently abrade the substrate surface. In conjunction with the applied electrical current, the bubbles serve as a suitable polishing agent. Such foams can be created by adding foaming agents or surfactants to the ECMP slurry of the present invention. In order to serve effectively as a polishing agent, surfactants should generally be present in the slurry of this invention in an amount ranging from about 1.0% to about 10.0% by weight. Preferred surfactants include, but are not limited to, dodecyl sulfate sodium salt, sodium lauryl sulfate, dodecyl sulfate ammonium salt, and mixtures thereof. Other examples of useful surfactants include TRITON® DF-16 manufactured by Union Carbide, and SURFYNOL® manufactured by Air Products and Chemicals.

To the above-described ECMP slurry, certain useful additives may be added. In one embodiment, a chelating agent is added to the slurry. The function of the chelating agent is to bind to material removed from the surface during polishing. Such removed material is referred to generally as detritus. This detritus can re-deposit onto the surface during polishing. In general this is undesirable. The chelating agent binds to the detritus forming complexes which remain in solution in the slurry. By remaining in the slurry, they do not re-deposit onto the polished surface. In some embodiments, the complexes created during polishing may act as polishing agents. For example, if a copper-containing metallization layer is being polished, copper ions removed during polishing bind with the chelating agent to form heavy metal complexes. These heavy metal complexes serve well as polishing agents. Other surface detritus can form complexes with the chelating agent and also perform as polishing agents. Suitable chelating agents include, but are not limited to, EDTA (ethylenediaminetetraacetate), dichloro-bis (methylamine), oxalate ion, as well as other polydentate ligands. Chelating agents are added to the ECMP slurry in a wide range of amounts. In one particular embodiment, an amount ranging from about 1.0 weight percent to about 5.0 weight percent can be used.

An additional ECMP slurry additive comprises a "film forming" agent. The film forming agent may be any compound or mixtures of compounds that are capable of facilitating the formation of a passivation layer of metal oxides and facilitating the dissolution of inhibiting layers on the surface of a metal layer. Passivation of a substrate surface layer is important to prevent wet etching of the substrate surface. Useful film forming agents are cyclic compounds such as imidazole, benzotriazole, benzimidazole and benzothiazole and their derivatives with hydroxy, amino, imino, carboxy, mercapto, nitro and alkyl substituted groups, as well as urea, thiourea and others. One preferred film forming agent is benzotriazole ("BTA"). The film forming agent should be present in the ECMP slurry of this invention in an amount that is capable of promoting quick, and preferably almost instantaneous formation of passivating layers and dissolution of inhibiting layers on the substrate surface. The film forming agent should be present in the ECMP slurry of this invention in an amount ranging from about 0.01 weight percent to about 5.0 weight percent. In a preferred embodiment, the film forming agent comprises from about 0.01–0.2 weight percent.

Other well-known polishing slurry additives may be incorporated into the electro chemical mechanical polishing slurry of this invention. One class of optional additives are inorganic acids, or citric acid or acetic acid, which may be added to the polishing slurry to further improve or enhance the polishing rate of the metal layers in the wafer. Also, oxidizers like hydrogen peroxide ($H_2O_2$) can be added to some embodiments.

BTA, or other film forming agents in the ECMP slurry of this invention, may destabilize the uniform dispersion of abrasive in the slurry. In order to promote stabilization of an ECMP slurry of this invention against settling, flocculation, and decomposition, a variety of optional stabilization agents, such as surfactants, stabilizers, or dispersing agents, can be used. If a surfactant is added to the CMP slurry, then it may be an anionic, cationic, nonionic, or amphoteric surfactant or a combination of two or more surfactants can be employed. Furthermore, it has been found that the addition of a surfactant may be useful to reduce the within-wafer-non-uniformity (WIWNU) of the wafers, thereby improving the surface of the wafer and reducing wafer defects.

In general, the amount of stabilizing agent (stabilizer), such as a surfactant, that can be used in the present invention should be sufficient to achieve effective stabilization of the slurry and will typically vary depending on the particular surfactant selected and the nature of the surface of the metal oxide abrasive. For example, if not enough of a selected surfactant is used, it will have little or no effect on ECMP slurry stabilization. Furthermore, the stabilizing agent may be added directly to the slurry or treated onto the surface of the metal oxide abrasive utilizing known techniques. In either case, the amount of additive is adjusted to achieve the desired concentration in the polishing slurry. Preferred surfactants include dodecyl sulfate sodium salt, sodium lauryl sulfate, dodecyl sulfate ammonium salt, and mixtures thereof. Examples of useful surfactants include TRITON® DF-16 manufactured by Union Carbide, and SURFYNOL® manufactured by Air Products and Chemicals.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as define in the following claims. In particular, it is contemplated by the inventors that other materials can be used to form the calibration and protective layers in accordance with the principles of the present invention. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A method for electro chemical mechanical polishing a substrate having a metal layer formed on a surface thereof, the process comprising the steps of:

flowing an electro chemical mechanical polishing (ECMP) slurry having a high viscosity and including a polishing agent over a portion of the substrate;

passing an electrical current through the ECMP slurry and the substrate;

padlessly abrading the surface of the substrate such that mechanical forces generated by flowing the ECMP slurry over the substrate abrade the surface; and said abrading, in combination with the electrical current flowed through the ECMP slurry and the substrate, removing at least a portion of the metal layer from the substrate.

2. The method as in claim 1 wherein abrading the surface of the substrate comprises abrasively removing material from the surface of the substrate using the polishing agent of the ECMP slurry.

3. The method as in claim 2 wherein the ECMP slurry includes a high viscosity solvent.

4. The method as in claim 3 wherein the high viscosity solvent comprises ethylene glycol.

5. The method as in claim 1 wherein the ECMP slurry further includes a chelating agent.

6. The method as in claim 1 wherein the ECMP slurry further includes a film forming agent.

7. The method of claim 1 wherein the polishing agent includes abrasives.

8. The method of claim 1 wherein the polishing agent comprises a foaming agent which is induced to form bubbles in the ECMP slurry.

9. The method of claim 1 wherein the polishing agent includes detritus removed from the surface of the substrate during the electro chemical mechanical polishing process.

10. The method of claim 1 wherein the polishing agent comprises copper-containing detritus removed from the metal layer during the electro chemical mechanical polishing process.

11. The method as in claim 1 wherein the passing of electrical current through the slurry and the substrate comprises passing an electrical current in the range of about 5 milliamps (mA)/cm$^2$ to about 50 mA/cm$^2$ through the electro chemical mechanical polishing slurry and the substrate.

12. The method as in claim 11 wherein the passing of electrical current through the slurry and the substrate comprises passing a direct electrical current through the electro chemical mechanical polishing slurry and the substrate.

13. The method as in claim 11 wherein the passing of electrical current through the slurry and the substrate comprises passing a series of electrical current pulses through the electro chemical mechanical polishing slurry and the substrate.

14. The method as in claim 13 wherein the degree of planarizing in the surface is controlled by controlling a duty cycle for the electrical current.

15. The method as in claim 13 wherein the degree of planarizing in the surface is controlled by controlling the pulse time of the electrical current and by controlling the time interval between pulses of electrical current.

16. The method as in claim 2 wherein the flowing of electro chemical mechanical polishing slurry over a portion of the substrate is accomplished by, submerging a substrate surface to be polished in a electro chemical mechanical polishing slurry bath; and moving the substrate in the bath such that the slurry flows over a portion of the metal layer.

17. The method as in claim 16 wherein moving the substrate comprises rotating the substrate in the slurry bath such that the slurry flows over a portion of the metal layer.

18. The method as in claim 2 wherein the flowing of electro chemical mechanical polishing slurry over a portion of the substrate is accomplished by, flowing the slurry out of an effluent tube onto a portion of the substrate surface.

19. A method for electro chemical mechanical polishing a substrate having a copper layer formed on a surface thereof, the process comprising the operations of:

providing a substrate having a copper layer formed on a surface thereof;

flowing an electro chemical mechanical polishing (ECMP) slurry over a portion of the surface of the substrate to generate mechanical forces between the surface and the slurry, wherein the slurry has a high viscosity and includes a polishing agent;

passing an electrical current through the ECMP slurry and the substrate;

padlessly abrading the surface of the substrate such that the mechanical forces generated by flowing the ECMP slurry over the substrate abrade the surface; and said abrading, in combination with the electrical current flowed through the ECMP slurry and the substrate, removing at least a portion of the copper layer from the substrate.

20. The method of claim 19, wherein the polishing agent includes detritus removed from the surface of the substrate during the electro chemical mechanical polishing process.

21. The method as in claim 19 wherein the passing of electrical current through the slurry and the substrate comprises passing an electrical current in the range of about 5 milliamps (mA)/cm$^2$ to about 50 mA/cm$^2$ through the electro chemical mechanical polishing slurry and the substrate.

22. The method as in claim 21 wherein the passing of electrical current through the slurry and the substrate comprises passing a direct electrical current through the electro chemical mechanical polishing slurry and the substrate.

23. The method as in claim 21 wherein the passing of electrical current through the slurry and the substrate comprises passing a series of electrical current pulses through the electro chemical mechanical polishing slurry and the substrate.

24. The method as in claim 23 wherein the degree of planarizing in the surface is controlled by controlling the pulse time of the electrical current and by controlling the time interval between pulses of electrical current.

25. The method as in claim 19 wherein the flowing of electro chemical mechanical polishing slurry over a portion of the substrate is accomplished by, submerging a substrate surface to be polished in a electro chemical mechanical polishing slurry bath; and moving the substrate in the bath such that the slurry flows over a portion of the copper layer.

26. The method as in claim 25 wherein moving the substrate comprises rotating the substrate in the slurry bath such that the slurry flows over a portion of the copper layer.

27. The method as in claim 19 wherein the flowing of electro chemical mechanical polishing slurry over a portion of the substrate is accomplished by, flowing the slurry out of an effluent tube onto a portion of the substrate surface.

* * * * *